United States Patent
Michigami et al.

(10) Patent No.: US 10,177,740 B2
(45) Date of Patent: Jan. 8, 2019

(54) LADDER FILTER AND DUPLEXER

(71) Applicant: Murata Manufacturing Co., Ltd., Nagaokakyo-shi, Kyoto-fu (JP)

(72) Inventors: Akira Michigami, Nagaokakyo (JP); Koichiro Kawasaki, Nagaokakyo (JP); Takuma Kuzushita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 7 days.

(21) Appl. No.: 15/468,143

(22) Filed: Mar. 24, 2017

(65) Prior Publication Data
US 2017/0194938 A1 Jul. 6, 2017

Related U.S. Application Data

(63) Continuation of application No. PCT/JP2015/076759, filed on Sep. 18, 2015.

(30) Foreign Application Priority Data

Oct. 6, 2014 (JP) .................. 2014-205547

(51) Int. Cl.
*H03H 9/60* (2006.01)
*H03H 9/64* (2006.01)
*H03H 9/145* (2006.01)
*H03H 9/72* (2006.01)
*H03H 9/02* (2006.01)

(52) U.S. Cl.
CPC .......... *H03H 9/64* (2013.01); *H03H 9/02992* (2013.01); *H03H 9/145* (2013.01);
(Continued)

(58) Field of Classification Search
CPC ...... H03H 9/64; H03H 9/02992; H03H 9/145; H03H 9/605; H03H 9/6483; H03H 9/725
(Continued)

(56) References Cited

U.S. PATENT DOCUMENTS

2004/0196119 A1   10/2004   Shibahara et al.
2008/0169884 A1   7/2008    Matsumoto et al.
(Continued)

FOREIGN PATENT DOCUMENTS

JP   05-167387 A   7/1993
JP   08-65089 A    3/1996
(Continued)

OTHER PUBLICATIONS

Official Communication issued in International Patent Application No. PCT/JP2015/076759, dated Nov. 2, 2015.

*Primary Examiner* — Stephen E. Jones
*Assistant Examiner* — Samuel S Outten
(74) *Attorney, Agent, or Firm* — Keating & Bennett, LLP

(57) ABSTRACT

A ladder filter includes a piezoelectric substrate, an insulating film on the piezoelectric substrate, first and second electrodes provided on the piezoelectric substrate and including a pair of busbars and plurality of electrode fingers, a first line electrode at least a portion of which is defined by the busbar at one side of the first electrode, a second line electrode at least a portion of which is defined by the busbar at one side of the second electrode, and a third line electrode laminated on the second line electrode. The first line electrode and the second line electrode are electrically connected to different electric potentials. The first line electrode is separated from the second line electrode by a predetermined distance. At least a portion of the third line electrode is overlapped with at least a portion of the first line electrode with the insulating film interposed therebetween in a laminating direction.

20 Claims, 4 Drawing Sheets

(52) U.S. Cl.
CPC .......... *H03H 9/605* (2013.01); *H03H 9/6483* (2013.01); *H03H 9/725* (2013.01)

(58) Field of Classification Search
USPC .......................................................... 333/193
See application file for complete search history.

(56) References Cited

U.S. PATENT DOCUMENTS

| | | | |
|---|---|---|---|
| 2011/0140808 A1* | 6/2011 | Kurahashi | H03H 9/0222 333/193 |
| 2011/0199168 A1 | 8/2011 | Kadota | |
| 2013/0127565 A1* | 5/2013 | Nishihara | H03H 9/02102 333/133 |
| 2015/0312681 A1* | 10/2015 | Ruile | B06B 1/06 381/190 |
| 2016/0049920 A1 | 2/2016 | Kishino | |

FOREIGN PATENT DOCUMENTS

| | | |
|---|---|---|
| JP | 08-307191 A | 11/1996 |
| JP | 2000-196412 A | 7/2000 |
| JP | 2004-282707 A | 10/2004 |
| JP | 2007-174307 A | 7/2007 |
| JP | 2007-259023 A | 10/2007 |
| JP | 2008-172711 A | 7/2008 |
| JP | 2009-182407 A | 8/2009 |
| KR | 10-2004-0076222 A | 8/2004 |
| KR | 10-2011-0084244 A | 7/2011 |
| WO | 2014/133084 A1 | 9/2014 |

* cited by examiner

LADDER FILTER AND DUPLEXER

CROSS REFERENCE TO RELATED APPLICATIONS

This application claims the benefit of priority to Japanese Patent Application No. 2014-205547 filed on Oct. 6, 2014 and is a Continuation Application of PCT Application No. PCT/JP2015/076759 filed on Sep. 18, 2015. The entire contents of each application are hereby incorporated herein by reference.

BACKGROUND OF THE INVENTION

1. Field of the Invention

The present invention relates to a ladder filter including plurality of elastic wave resonators and a duplexer that includes the ladder filter as a transmission filter.

2. Description of the Related Art

Ladder surface acoustic wave filters have been used for, for example, transmission filters included in duplexers in cellular phones.

Japanese Unexamined Patent Application Publication No. 2000-196412 and Japanese Unexamined Patent Application Publication No. 8-307191 disclose ladder filters including plurality of resonators composed of interdigital transducer (IDT) electrodes. In Japanese Unexamined Patent Application Publication No. 2000-196412, a line including a busbar of one IDT electrode and a line including a busbar of another IDT electrode are arranged so as to not be overlapped with each other when viewed from a plan view. In contrast, in Japanese Unexamined Patent Application Publication No. 8-307191, a busbar of one IDT electrode and a busbar of another IDT electrode are arranged so as to be overlapped with each other with a dielectric thin film interposed therebetween when viewed from a plan view.

However, since the lines are arranged so as to not be overlapped with each other in the ladder filter in Japanese Unexamined Patent Application Publication No. 2000-196412, it is difficult to reduce the size of the ladder filter.

In contrast, since the busbars having thin film thicknesses are overlapped with each other with a dielectric thin film interposed therebetween, as in electrode finger portions, in Japanese Unexamined Patent Application Publication No. 8-307191, the resistance component can be increased in size. Accordingly, the loss can be increased.

SUMMARY OF THE INVENTION

Preferred embodiments of the present invention provide a ladder filter and a duplexer with reduced size and low loss.

According to a preferred embodiment of the present invention, a ladder filter includes a plurality of series arm resonators provided on a series arm that electrically connects an input terminal to an output terminal and a plurality of parallel arm resonators provided on a plurality of individual parallel arms that electrically connect the series arm to a ground potential. The ladder filter includes a piezoelectric substrate; an insulating film arranged on the piezoelectric substrate; first and second IDT electrodes that are provided on the piezoelectric substrate and that each include a pair of busbars and a plurality of electrode fingers respectively electrically connected to the pair of busbars; a first line electrode which is provided on the piezoelectric substrate and at least a portion of which is defined by the busbar at one side of the first IDT electrode; a second line electrode which is provided on the piezoelectric substrate and at least a portion of which is defined by the busbar at one side of the second IDT electrode; and a third line electrode laminated on the second line electrode. The first and second IDT electrodes are defined by the plurality of series arm resonators or the plurality of parallel arm resonators. The first line electrode and the second line electrode are electrically connected to different electric potentials. The first line electrode is separated from the second line electrode by a predetermined distance. At least a portion of the third line electrode is overlapped with at least a portion of the first line electrode with the insulating film interposed therebetween in a laminating direction.

According to a preferred embodiment of the present invention, a width of the second line electrode, which is a dimension along a direction in which the plurality of electrode fingers extend, is smaller than a width of the first line electrode, which is a dimension along a direction in which the plurality of electrode fingers extend.

According to a preferred embodiment of the present invention, a thickness of the first line electrode is equal or substantially equal to a thickness of the second line electrode.

According to a preferred embodiment of the present invention, a thickness of the third line electrode is greater than thicknesses of the first and second line electrodes.

According to a preferred embodiment of the present invention, the plurality of parallel arm resonators include a first parallel arm resonator and a second parallel arm resonator. The first parallel arm resonator is provided on a first parallel arm of the plurality of parallel arms, and includes the first IDT electrode. The second parallel arm resonator is provided on a second parallel arm of the plurality of parallel arms that is different from the first parallel arm and includes the second IDT electrode.

According to a preferred embodiment of the present invention, at least a portion of the first parallel arm resonator is overlapped with at least a portion of the second parallel arm resonator in a direction in which the plurality of electrode fingers extend.

According to a preferred embodiment of the present invention, one end of the first line electrode is electrically connected to the first parallel arm resonator and another end of the first line electrode is electrically connected to the ground electric potential. One end of the second line electrode is electrically connected to the second parallel arm resonator and another end of the second line electrode is electrically connected to at least one series arm resonator of the plurality of series arm resonators.

According to a preferred embodiment of the present invention, the parallel arm on which the first parallel arm resonator is provided is adjacent to or in a vicinity of the parallel arm on which the second parallel arm resonator is provided.

Other preferred embodiments of the present invention provide duplexers including a transmission filter and a reception filter. The transmission filter includes the ladder filter according to various preferred embodiments of the present invention.

In preferred embodiments of the present invention, the third line electrode is laminated on the second line electrode, as described above, and at least a portion of the third line electrode includes a portion that is overlapped with at least a portion of the first line electrode with the insulating film interposed therebetween in the laminating direction. Accordingly, according to various preferred embodiments of the present invention, it is possible to provide ladder filters and duplexers with reduced size and low loss.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will herein be clarified by describing specific preferred embodiments of the present invention with reference to the attached drawings.

Figure 1:
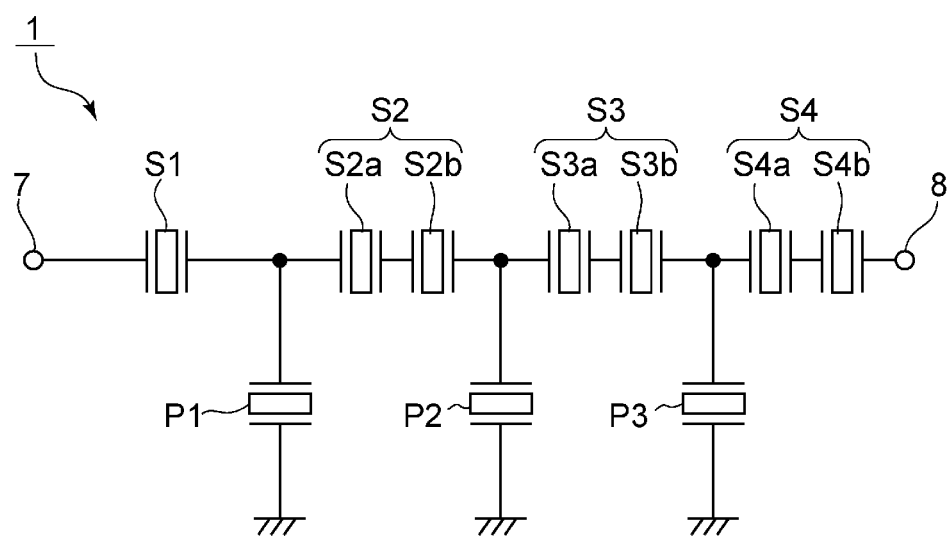
FIG. 1 is a circuit diagram of a ladder filter according to a preferred embodiment of the present invention.
Figure 2A:
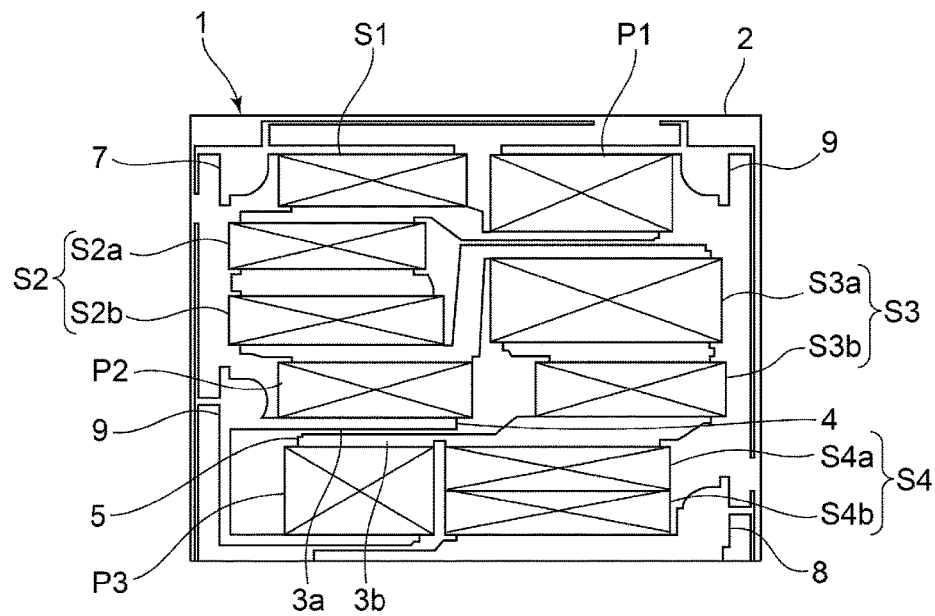
FIG. 2A is a schematic plan view showing a structure in which an insulating film and a third line electrode are removed from the ladder filter shown in FIG. 1.
Figure 2B:
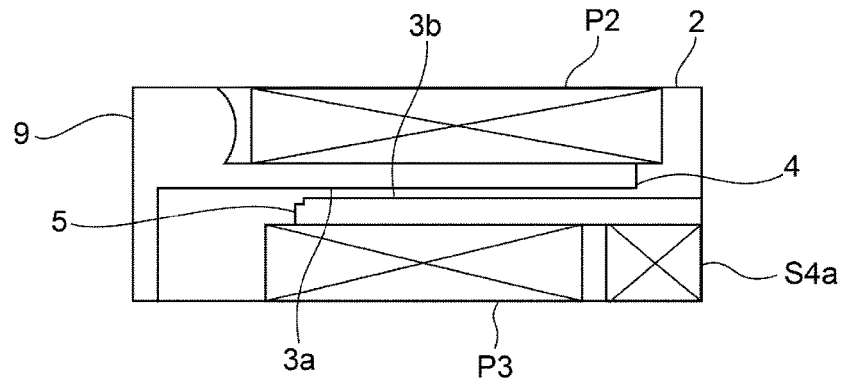
FIG. 2B is a schematic plan view showing an enlargement of a portion of the ladder filter where two parallel arm resonators are provided.
Figure 2C:
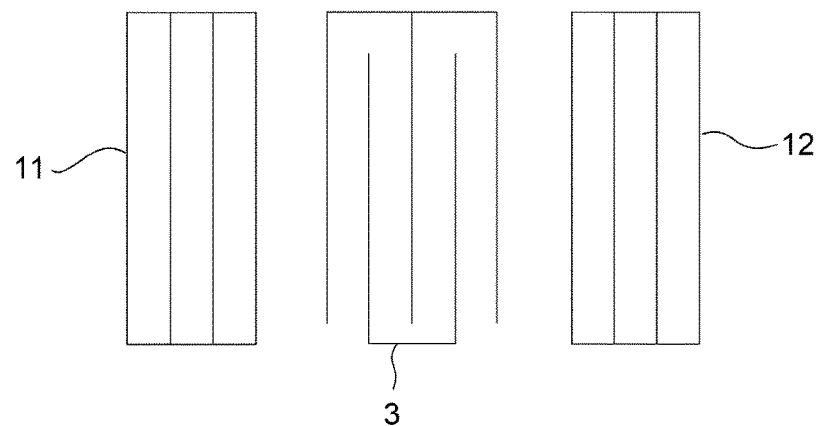
FIG. 2C is a schematic plan view showing an electrode structure of a one-port elastic wave resonator.

FIG. 1 is a circuit diagram of a ladder filter 1 according to a preferred embodiment of the present invention. FIG. 2A is a schematic plan view showing a structure in which an insulating film and a third line electrode are removed from the ladder filter shown in FIG. 1. FIG. 2B is a schematic plan view showing an enlargement of a portion of the ladder filter where a parallel arm resonator P2 and a parallel arm resonator P3 are provided. FIG. 2C is a schematic plan view showing an electrode structure of a one-port elastic wave resonator.

In the ladder filter 1 shown in FIG. 1, a series arm includes series arm resonators S1, S2, S3, and S4 that are electrically connected in series between an input terminal 7 and an output terminal 8. The series arm resonator S2 is divided into two divided resonators S2a and S2b. Similarly, the series arm resonator S3 is divided into two divided resonators S3a and S3b, and the series arm resonator S4 is divided into two divided resonators S4a and S4b.

A parallel arm resonator P1 and the parallel arm resonators P2 and P3 are respectively included on a plurality of individual parallel arms. The parallel arm resonator P1 is electrically connected between a node between located the series arm resonator S1 and the series arm resonator S2 and a ground potential. Similarly, the parallel arm resonator P2 is electrically connected between a node located between the series arm resonator S2 and the series arm resonator S3 and the ground potential. The parallel arm resonator P3 is electrically connected between a node located between the series arm resonator S3 and the series arm resonator S4 and the ground potential. Each of the series arm resonators S1, S2 (including the divided resonators S2a and S2b), S3 (including the divided resonators S3a and S3b), and S4 (including the divided resonators S4a and S4b) and the parallel arm resonators P1, P2, and P3 is a one-port elastic wave resonator.

The one-port elastic wave resonator includes the electrode structure shown in FIG. 2C. Specifically, an IDT electrode 3 and reflectors 11 and 12, which are arranged at both sides of the one-port elastic wave resonator in an elastic wave propagation direction of the IDT electrode 3, are provided on a main surface of a piezoelectric substrate to provide the one-port elastic wave resonator.

The IDT electrode 3 includes a metallic material, for example, Al, Cu, Pt, Au, Ag, Ti, Ni, Cr, Mo, W, or an alloy containing any of these metallic materials as a major component. The IDT electrode 3 may include a single layer or may be a multilayer body including at least two different metallic layers that are laminated, for example.

The IDT electrode 3 includes a plurality of first electrode fingers and plurality of second electrode fingers. The plurality of first electrode fingers and the plurality of second electrode fingers extend in a direction perpendicular or substantially perpendicular to the elastic wave propagation direction. The plurality of first electrode fingers and the plurality of second electrode fingers are alternately arranged. One end of the plurality of first electrode fingers is electrically connected to a first busbar and one end of the plurality of second electrode fingers is electrically connected to a second busbar.

As shown in FIG. 2A, the ladder filter 1 includes a piezoelectric substrate 2 with a rectangular or substantially rectangular plate shape. The piezoelectric substrate 2 is preferably a piezoelectric single crystal substrate including LiTaO$_3$ or LiNbO$_3$, for example. The piezoelectric substrate 2 may include piezoelectric ceramics, for example. In the present preferred embodiment, the piezoelectric substrate 2 preferably includes LiNbO$_3$, for example.

FIG. 2A schematically shows a portion of the ladder filter 1 where the plurality of first electrode fingers and the plurality of second electrode fingers in the IDT electrode 3 of each of the series arm resonators S1, S2 (including the divided resonators S2a and S2b), S3 (including the divided resonators S3a and S3b), and S4 (including the divided resonators S4a and S4b) and the parallel arm resonators P1, P2, and P3 are alternately arranged, as shown in FIG. 2A by rectangular blocks with diagonal lines. The first and second busbars of the IDT electrode 3 are located at both ends of the IDT electrode 3 in a direction in which the electrode fingers in each block extend.

As shown in FIG. 2A and FIG. 2B, a first busbar 3a of the IDT electrode 3 of the parallel arm resonator P2 is defined by at least a portion of a first line electrode 4. A second busbar 3b of the IDT electrode 3 of the parallel arm resonator P3 is defined by at least a portion of a second line electrode 5.

As shown in FIG. 2A and FIG. 2B, the parallel arm resonator P2 is electrically connected, via the first line electrode 4, to an electrode land 9 that is electrically connected to the ground potential. More specifically, one end of the first line electrode 4 is electrically connected to the electrode land 9 and another end of the first line electrode 4 is electrically connected to the parallel arm resonator P2.

The parallel arm resonator P3 is electrically connected to the series arm resonators S3 and S4 via the second line electrode 5. One end of the second line electrode 5 is electrically connected to the parallel arm resonator P3 and another end of the second line electrode 5 is electrically connected to the series arm resonators S3 and S4. Accordingly, the second line electrode 5 is electrically connected to an electric potential that is different from an electric potential of the first line electrode 4.

In the present preferred embodiment, at least a portion of the parallel arm resonator P2 is overlapped with at least a portion of the parallel arm resonator P3 in or substantially in the direction in which the electrode fingers of the IDT electrode 3 extend. Accordingly, the characteristic structures, features, and elements of the present invention, as described below, are able to be easily applied.

Figure 3:
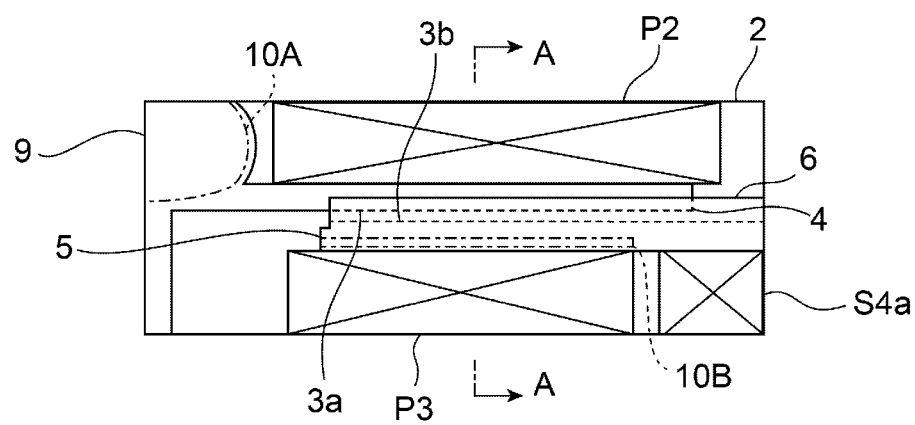
FIG. 3 is a schematic plan view showing a structure in which the third line electrode and the insulating film are applied to the portion shown in FIG. 2B where the two parallel arm resonators in the ladder filter are provided.

FIG. 3 is a schematic plan view showing a structure in which a third line electrode 6 and the insulating film are applied to the portion of the ladder filter 1 shown in FIG. 2B, that is, the portion of the ladder filter 1 where the parallel arm resonator P2 and the parallel arm resonator P3 in the ladder filter are provided. For clarity, the insulating film is not shown in FIG. 3 and only a portion of the ladder filter 1 where the insulating film is provided is shown in FIG. 3. In the schematic plan view of FIG. 3, the third line electrode 6 is provided on the second line electrode 5 shown FIG. 2B. A portion of the ladder filter 1 resulting from removal of the area of a corner portion outside an alternate long and short dash line 10A in FIG. 3 and a portion of the ladder filter 1 surrounded by an alternate long and short dash line 10B are covered with the insulating film. A portion of the third line electrode 6 is overlapped with a portion of the first line electrode 4 with the insulating film interposed therebetween. In the present preferred embodiment, the third line electrode 6 and the first line electrode 4 are preferably partially overlapped with each other with the insulating film interposed therebetween when viewed from a plan view toward the main surface side of the piezoelectric substrate 2, for example. An entire portion of the first line electrode 4 including the busbar electrically connected to the electrode fingers may be overlapped with the third line electrode 6 when viewed from a plan view toward the main surface side of the piezoelectric substrate 2, for example.

Figure 4:
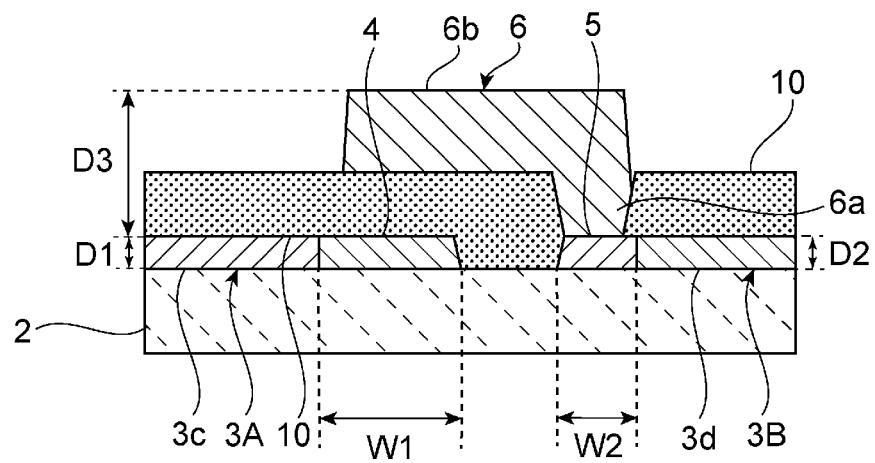
FIG. 4 is a schematic cross-sectional view of the ladder filter shown in FIG. 3.

FIG. 4 is a schematic cross-sectional view taken along line A-A of the ladder filter shown in FIG. 3. The positional relationship between the first to third line electrodes 4 to 6 and an insulating film 10 on the piezoelectric substrate 2 is described below with reference to the schematic cross-sectional view of FIG. 4.

As shown in FIG. 4, first and second IDT electrodes 3A and 3B are provided on the main surface of the piezoelectric substrate 2. The first IDT electrode 3A defines the parallel arm resonator P2, and the second IDT electrode 3B defines the parallel arm resonator P3.

The first IDT electrode 3A includes an electrode finger portion 3c of the first IDT electrode 3A, which includes the plurality of first and second electrode fingers, and the first and second busbars, which are not shown in FIG. 4. The second IDT electrode 3B includes an electrode finger portion 3d of the second IDT electrode 3B, which includes the plurality of first and second electrode fingers, and the first and second busbars, which are not shown in FIG. 4. The insulating film 10 is provided on the electrode finger portion 3c of the first IDT electrode 3A and the electrode finger portion 3d of the second IDT electrode 3B.

The insulating film 10 preferably includes, for example, $SiO_2$, which is a dielectric material. However, the material of the insulating film 10 is not specifically limited. The insulating film 10 may include, for example, $SiO_2$, SiN, or a resin material, such as polyimide, or a general dielectric film including, for example, $SiO_2$, $Si_3N_4$, SiON, SiC, $Ta_2O_5$, $TiO_2$, TiN, $Al_2O_3$, or $TeO_2$, in a single layer structure or a multilayer structure. In addition, the insulating film 10 may be omitted and not provided on the electrode finger portion 3c of the first IDT electrode 3A and the electrode finger portion 3d of the second IDT electrode 3B, for example.

The first busbar of the first IDT electrode 3A is defined by at least a portion of the first line electrode 4. The second busbar of the second IDT electrode 3B is defined by at least a portion of the second line electrode 5.

The first and second line electrodes 4 and 5 are provided on the piezoelectric substrate 2 and extend along or substantially along the elastic wave propagation direction. A portion of the first line electrode 4 that defines the busbar of the first line electrode 4 is separated from a portion of the second line electrode 5 that defines the busbar of the second line electrode 5 by a predetermined distance. In particular, in the present preferred embodiment, the insulating film 10 is provided between the portions of the first and second line electrodes 4 and 5 that are separated from each other. A gap between portions of the first and second line electrodes 4 and 5 that are adjacent to or in a vicinity of each other may be filled with the insulating film 10 to completely or substantially completely separate the first line electrode 4 from the second line electrode 5. Accordingly, the first line electrode 4 is electrically insulated from the second line electrode 5 by the insulating film 10 interposed therebetween. A width W2, which is a dimension along the direction of the electrode fingers, of the second line electrode 5 extending along or substantially along the elastic wave propagation direction is smaller than a width W1, which is a dimension along the direction of the electrode fingers, of the first line electrode 4 extending along or substantially along the elastic wave propagation direction.

A thickness D1 of the first line electrode 4 extending upward from the main surface of the piezoelectric substrate 2 is equal or substantially equal to a thickness D2 of the second line electrode 5. The thickness D1 of the first line electrode 4, which is equal or substantially equal to the thickness D2 of the second line electrode 5, as in the present preferred embodiment, is preferred because the first and second line electrodes 4 and are able to be manufactured through a common or similar process, for example. The thickness D1 of the first line electrode 4 may be different from the thickness D2 of the second line electrode 5 in the present preferred embodiment, for example. Although the thicknesses D1 and D2 of the first and second line electrodes 4 and 5 are not specifically limited, each of the thicknesses D1 and D2 of the first and second line electrodes 4 and 5 is preferably within a range from about several tens of nanometers to about several hundreds of nanometers, for example.

The first and second line electrodes 4 and 5 are each preferably formed by laminating an NiCr alloy, Pt, Ti, an AlCu alloy, and Ti in this order, for example. However, the material of the first and second line electrodes 4 and 5 is not specifically limited. The first and second line electrodes 4 and 5 may include, for example, a metallic material such as Al, Cu, Pt, Au, Ag, Ti, Ni, Cr, Mo, W, or an alloy containing any of the metallic materials as a major component. Each of the first and second line electrodes 4 and 5 may include a single layer or may be a multilayer body in which metallic layers of two or more types are laminated, for example, as described above with respect to the present preferred embodiment. The first and second line electrodes 4 and 5 may include, for example, the same material or may include different materials. Preferably, for example, the thickness of each layer in the present preferred embodiment is: NiCr alloy: about 10 nm, Pt: about 70 nm, Ti: about 60 nm, AlCu alloy: about 130 nm, and Ti: about 10 nm.

The third line electrode 6 is laminated on the second line electrode 5. A portion of the third line electrode 6 is overlapped with a portion of the first line electrode 4 with the insulating film 10 interposed therebetween in the laminating direction. A thickness D3 of the third line electrode 6 arranged on the insulating film 10 is greater than the thickness D1 of the first line electrode 4 and the thickness D2 of the second line electrode 5. The thickness D3 of the third line electrode 6 is greater than the thickness D1 of the first line electrode 4 and the thickness D2 of the second line electrode 5 to provide low loss.

The third line electrode 6 preferably is formed by laminating Ti, an AlCu alloy, Ti, and Pt. However, the material of the third line electrode 6 is not specifically limited. The third line electrode 6 may include, for example, a metallic material such as Al, Cu, Pt, Au, Ag, Ti, Ni, Cr, Mo, W, or an alloy containing any of the metallic materials as a major component. The third line electrode 6 may include a single layer or include a multilayer body in which metallic layers of two or more types are laminated, for example, as described above with respect to the present preferred embodiment. The third line electrode 6 may include, for example the same material as the material of the first and second line electrodes 4 and 5 or may include a material different from those of the first and second line electrodes 4 and 5. Although the film thickness of the third line electrode 6 is not specifically limited, the third line electrode 6 preferably has a film thickness between about 1,000 nm and about 3,000 nm to provide low loss.

When the first and second line electrodes 4 and 5 are electrically connected to different electric potentials, as described above with respect to the present preferred embodiment, the first line electrode 4 and the second line electrode 5 are preferably arranged, for example, so that the first line electrode 4 is separated from the second line electrode 5 by at least a predetermined distance to significantly reduce or prevent the occurrence of a short circuit. However, separating line electrodes may, for example, increase the overall size of a filter. In addition, by providing small dimensions for the widths of line electrodes, resistance is increased due to the narrow line widths, and thus loss due to resistance is increased. Accordingly, it has previously been difficult to reduce the size of a ladder filter.

In the ladder filter 1, a portion of the third line electrode 6 laminated on the second line electrode 5 includes a first portion 6a of the third line electrode 6 and a second portion 6b of the third line electrode 6. The first portion 6a is provided in an opening of the insulating film 10, from which the busbar of the second IDT electrode 3B is exposed. The second portion 6b extends from the first portion 6a to the first line electrode 4 side along an upper surface of the insulating film 10. In the present preferred embodiment, the opening is a portion indicated by line 10B in FIG. 3, which includes alternating long and short dashes. When viewed from a plan view toward the main surface of the piezoelectric substrate 2, the opening includes a rectangular or substantially rectangular shape with a longitudinal direction located in the direction in which the busbar of the second IDT electrode 3B extends.

In other words, when viewed from a plan view toward the main surface of the piezoelectric substrate 2, the second portion 6b of the third line electrode 6 is overlapped with a portion of the first line electrode 4 with the insulating film 10 interposed therebetween. Accordingly, the size of the ladder filter 1 is able to be reduced while maintaining the predetermined distance that separates the first and second line electrodes 4 and 5 that provide the busbars of the first and second IDT electrodes 3A and 3B, without increasing the width W2 of the second line electrode 5.

When the structure described is provided, there is a concern that loss may be increased due to the increase in the resistance value. However, a portion of the third line electrode is laminated on and joined to the second line electrode 5. Accordingly, the third line electrode 6 is electrically connected to the second line electrode 5 in the ladder filter 1, and low loss is able to be achieved. In addition, since the loss in the electric resistance is low, the width W2 of the second line electrode 5 to which the third line electrode 6 is joined is also able to be reduced. Thus, low loss is able to be achieved while further reducing the size of the ladder filter 1.

In the present preferred embodiment, the first line electrode 4 on which the third line electrode 6 is not directly laminated is electrically connected to the parallel arm resonator P2 and is not electrically connected to the series arm resonators S1 to S4. Accordingly, loss is able to be further significantly reduced or prevented, as described below with reference to FIG. 5.

Figure 5:
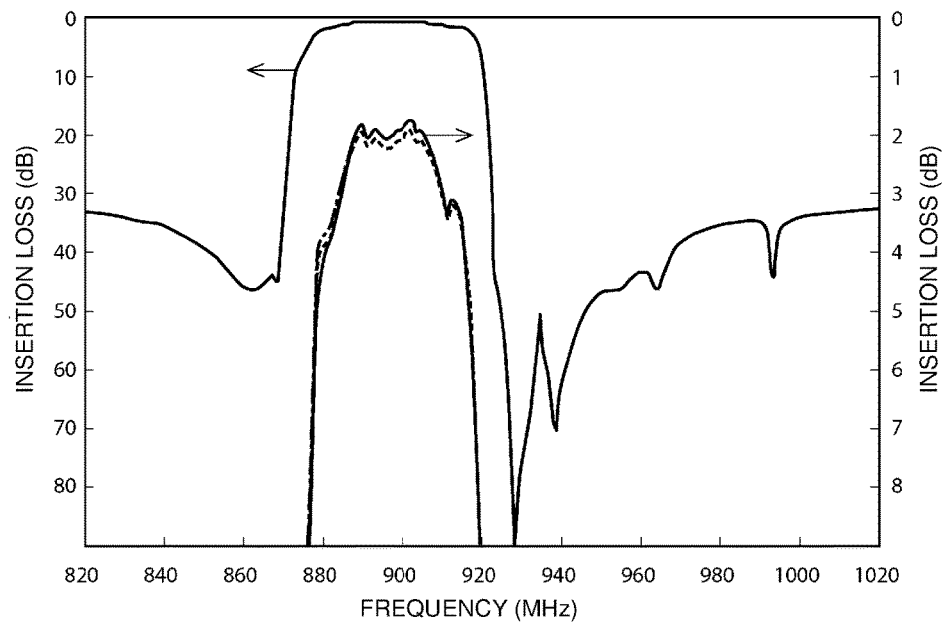
FIG. 5 is a graph showing attenuation-frequency characteristics when a resistance of 1Ω, is added to a series arm of the ladder filter and attenuation-frequency characteristics when a resistance of 1Ω, is added to a parallel arm.

FIG. 5 is a graph showing attenuation-frequency characteristics when a resistance of 1Ω, is added to the series arm of the ladder filter and attenuation-frequency characteristics when a resistance of 1Ω, is added to the parallel arm. Referring to FIG. 5, a solid line indicates the attenuation-frequency characteristics when the resistance of 1Ω, is added to the parallel arm and a broken line indicates the attenuation-frequency characteristics when the resistance of 1Ω, is added to the series arm. A line with alternating long and short dashes in FIG. 5 indicates attenuation-frequency characteristics when no resistance is added to the series arm and the parallel arm. The difference in the attenuation-frequency characteristics is small between the case in which the resistance of 1Ω, is added to the parallel arm and the case in which no resistance is added to the series arm and the parallel arm. Accordingly, the solid line is overlaid on the alternate long and short dash line in frequency bands excluding a frequency band near about 880 MHz in FIG. 5.

As shown in FIG. 5, since a Q factor near a resonant frequency is decreased when the resistance is added to the series arm, the loss is increased by about 0.2 dB in a wide range from about 890 MHz to about 910 MHz, for example, compared with the case in which no resistance is added to the series arm and the parallel arm. In contrast, when the resistance is added to the parallel arm, the loss is increased by about 0.2 dB only near about 880 MHz at the low frequency side, for example. Accordingly, the loss is able to be significantly reduced or prevented when the resistance is added to the parallel arm, compared with the case in which the resistance is added to the series arm.

Accordingly, the first line electrode 4 on which the third line electrode 6 is not directly laminated and in which an increase in the resistance value is liable to occur is preferably not electrically connected to the series arm resonators S1 to S4 and electrically connected to the parallel arm resonators P1 to P3. Accordingly, an increase in the loss is able to be significantly reduced or prevented.

Figure 6:
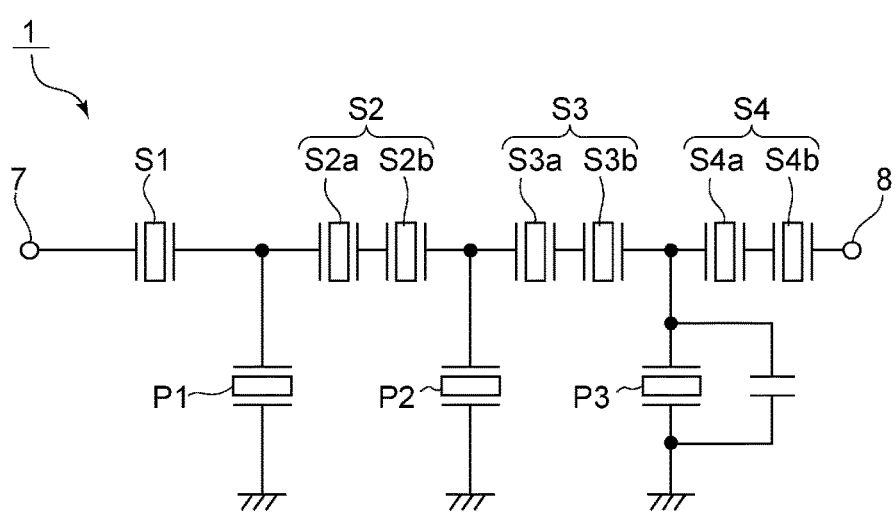
FIG. 6 is a circuit diagram showing an electrical connection of an electrostatic capacitance in parallel to one parallel arm resonator of the ladder filter shown in FIG. 1.

Referring back to FIG. 3, in the ladder filter 1, when viewed from a plan view toward the main surface of the piezoelectric substrate 2, a portion of the third line electrode defining the busbar of the second IDT electrode of the parallel arm resonator P3, which is electrically connected to the electrode land 9, is overlapped with a portion of the first line electrode 4 electrically connected to the parallel arm resonator P2 with the insulating film 10 interposed therebetween. Accordingly, an electrostatic capacitance is electrically connected in parallel to the parallel arm resonator P3 in the ladder filter 1, as shown in a circuit diagram in FIG. 6. When the electrostatic capacitance is generated, the anti-resonant frequency of the parallel arm resonator P3 moves toward a lower frequency, which increases the sharpness between the resonant frequency and the anti-resonant frequency in impedance characteristics of the parallel arm resonator P3. The value of a fractional bandwidth, which is a ratio calculated by dividing the difference between the resonant frequency and the anti-resonant frequency by the resonant frequency, may be applied as an index of the sharpness. The value of the fractional bandwidth decreases as the anti-resonant frequency moves toward a lower frequency and the sharpness of the resonator increases. Since the sharpness of the impedance between the resonant frequency and the anti-resonant frequency is increased in the parallel arm resonator P3 having a low fractional bandwidth when the configuration in which the electrostatic capacitance is electrically connected in parallel to the parallel arm resonator P3 is provided, the sharpness is able to be increased at low frequencies outside the pass band of the ladder filter.

Although the present preferred embodiment is preferably applied in the portion where the parallel arm resonator P2 and the parallel arm resonator P3 are provided in the ladder filter 1, preferred embodiments of the present invention are able to be applied to any two parallel arm resonators of the plurality of parallel arm resonators. However, preferred embodiments of the present invention are preferably applied to a case in which two parallel arm resonators are adjacent to or in a vicinity of each other, as in the present preferred embodiment, for ease of application and implementation.

A duplexer according to a preferred embodiment of the present invention includes a transmission filter and a reception filter. The transmission filter includes the ladder filter 1 according to a preferred embodiment of the present invention described above. Accordingly, a duplexer according to a preferred embodiment of the present invention is able to be reduced in size while providing low loss.

In particular, when the resonators that are divided in series are provided to improve the electric power handling capability, as in the ladder filter 1, size may be increased. Accordingly, preferred embodiments of the present invention are preferably applied to a duplexer including a transmission filter, for example, the ladder filter 1.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A ladder filter comprising:
a plurality of series arm resonators provided on a series arm that connects an input terminal to an output terminal;
a plurality of parallel arm resonators provided on a plurality of individual parallel arms that connect the series arm to a ground potential;
a piezoelectric substrate;
an insulating film arranged on the piezoelectric substrate;
first and second interdigital transducer electrodes that are provided on the piezoelectric substrate and that each include a pair of busbars and a plurality of electrode fingers, each electrode finger respectively electrically connected to a busbar of the pair of busbars;
a first line electrode provided on the piezoelectric substrate and at least a portion of which is defined by the busbar at one side of the first interdigital transducer electrode;
a second line electrode provided on the piezoelectric substrate and at least a portion of which is defined by the busbar at one side of the second interdigital transducer electrode; and
a third line electrode laminated on the second line electrode such that a portion of the third line electrode directly contacts the second line electrode; wherein
the first and second interdigital transducer electrodes are defined by the plurality of series arm resonators or the plurality of parallel arm resonators;
the first line electrode and the second line electrode are electrically connected to different electric potentials;
the first line electrode is separated from the second line electrode by a predetermined distance; and
at least a portion of the third line electrode is overlapped with at least a portion of the first line electrode with the insulating film interposed therebetween in a laminating direction.

2. The ladder filter according to claim 1, wherein:
the plurality of parallel arm resonators include a first parallel arm resonator and a second parallel arm resonator;
the first parallel arm resonator is provided on a first parallel arm of the plurality of parallel arms and includes the first interdigital transducer electrode; and
the second parallel arm resonator is provided on a second parallel arm of the plurality of parallel arms that is different from the first parallel arm and includes the second interdigital transducer electrode.

3. The ladder filter according to claim 2, wherein at least a portion of the first parallel arm resonator is overlapped with at least a portion of the second parallel arm resonator in a direction in which the plurality of electrode fingers of the first and second interdigital transducer electrodes extend.

4. The ladder filter according to claim 2, wherein:
one end of the first line electrode is electrically connected to the first parallel arm resonator and another end of the first line electrode is electrically connected to the ground potential; and
one end of the second line electrode is electrically connected to the second parallel arm resonator and another end of the second line electrode is electrically connected to at least one series arm resonator of the plurality of series arm resonators.

5. The ladder filter according to claim 2, wherein the parallel arm on which the first parallel arm resonator is provided is adjacent to or in a vicinity of the parallel arm on which the second parallel arm resonator is provided.

6. The ladder filter according to claim 1, wherein the insulating film is provided between the first line electrode and the second line electrode.

7. The ladder filter according to claim 6, wherein the insulating film completely or substantially completely separates the first line electrode from the second line electrode.

8. The ladder filter according to claim 1, wherein a width of the second line electrode, which is a dimension along a direction in which the plurality of electrode fingers of the first and second interdigital transducer electrodes extend, is smaller than a width of the first line electrode, which is a dimension along a direction in which the plurality of electrode fingers of the first and second interdigital transducer electrodes extend.

9. The ladder filter according to claim 1, wherein a thickness of the first line electrode is equal or substantially equal to a thickness of the second line electrode.

10. The ladder filter according to claim 1, wherein a thickness of the third line electrode is greater than thicknesses of the first and second line electrodes.

11. A duplexer comprising:
a transmission filter; and
a reception filter; wherein
the transmission filter includes the ladder filter according to claim 1.

12. The ladder filter according to claim 1, wherein each of the plurality of series arm resonators is divided into two divided resonators.

13. The ladder filter according to claim 1, wherein the first and second interdigital transducer electrodes each include a single metallic layer or a multilayer body of at least two different metallic layers.

14. The ladder filter according to claim 1, wherein
the plurality of electrode fingers include a plurality of first electrode fingers and a plurality of second electrode fingers; and
in each of the first and second interdigital transducer electrodes, the plurality of first electrode fingers are alternately arranged with the plurality of second electrode fingers.

15. The ladder filter according to claim 1, wherein the piezoelectric substrate has a rectangular or substantially rectangular plate shape and includes a piezoelectric single crystal substrate.

16. The ladder filter according to claim 1, wherein the insulating film is provided on an electrode finger portion of the first interdigital transducer electrode and on an electrode finger portion of the second interdigital transducer electrode.

17. The ladder filter according to claim 7, wherein the insulating film includes a dielectric material.

18. The ladder filter according to claim 1, wherein each of the first and second line electrodes is a laminate including an NiCr alloy, Pt, Ti, an AlCu alloy, and Ti.

19. The ladder filter according to claim 1, wherein the first and second line electrodes include different materials.

20. The ladder filter according to claim 1, wherein the third line electrode includes a laminate of Ti, an AlCu alloy, Ti, and Pt.

* * * * *